United States Patent [19]

Messer et al.

[11] Patent Number: 5,113,189
[45] Date of Patent: May 12, 1992

[54] FREQUENCY TRANSLATING COHERENT ANALOG TO DIGITAL CONVERSION SYSTEM FOR MODULATED SIGNALS

[75] Inventors: Dion D. Messer; Sangil Park; Charles D. Thompson, all of Austin, Tex.

[73] Assignee: Motorola, Inc., Schaumburg, Ill.

[21] Appl. No.: 718,891

[22] Filed: Jun. 21, 1991

[51] Int. Cl.$^5$ .............................................. H03M 1/12
[52] U.S. Cl. ....................................... 341/143; 341/155
[58] Field of Search ............... 341/143, 155, 158, 118, 341/166, 200, 157; 375/26, 25, 27, 28, 29, 30, 33, 34

[56] References Cited

U.S. PATENT DOCUMENTS

| | | | |
|---|---|---|---|
| 3,706,944 | 12/1970 | Tewksbury | 341/143 |
| 4,761,634 | 8/1988 | Yamaguchi et al. | 341/143 |
| 4,978,956 | 12/1990 | Berresheim | 341/155 |

*Primary Examiner*—Howard L. Williams
*Assistant Examiner*—Brian K. Young
*Attorney, Agent, or Firm*—Jonathan P. Meyer

[57] ABSTRACT

A analog to digital (A/D) conversion system (10 or 20) receives a modulated analog signal, translates the frequency of the signal to a lower frequency, and converts the analog signal to a filtered digital signal. In one form, the conversion system (10) has an analog signal multiplier (16), and A/D converter (18), an oscillator (12) and a frequency divider (14). Frequency multiplier (16) translates the frequency of the analog signal, and A/D converter (18) converts the analog signal to digital form. Frequency divider (14) receives a clock signal from oscillator (12) and divides the frequency of the clock signal. Because the same clock signal is used for frequency translation and analog to digital conversion, a phase error is not introduced in the output digital signal. Additionally, the frequency divider (14) forces the frequencies of the analog and digital signals to be an integer ratio for subsequent demodulation.

15 Claims, 1 Drawing Sheet

FREQUENCY TRANSLATING COHERENT ANALOG TO DIGITAL CONVERSION SYSTEM FOR MODULATED SIGNALS

FIELD OF THE INVENTION

This invention relates generally to data conversion systems, and more particularly to an analog to digital conversion system for modulated signals.

BACKGROUND OF THE INVENTION

During transmission of an information signal from a transmitter to a receiver, either the frequency or the amplitude of the information signal is typically modulated. When the amplitude of the information signal is modulated, the signal is able to transmit a substantial amount of information in a relatively short bandwidth. A carrier frequency at which an amplitude modulated information signal is transmitted is generally several hundred kilohertz, while an information bandwidth may be only ten to twenty kilohertz. Similarly, when a carrier frequency is modulated by an information signal, the information is transferred at a frequency in the megahertz range.

Most receivers, however, operate at significantly lower frequencies than the transmission frequency of either amplitude or frequency modulated signals. For example, an analog to digital converter is necessary to convert a transmitted analog signal to a digital signal for subsequent manipulation by the receiver. However, the operating frequency of an analog to digital converter is typically less than one hundred kilohertz. Therefore, the transmission frequency of either an amplitude modulated signal or a frequency modulated signal must be down converted until a frequency is reached at which the analog to digital converter may function properly. Additionally, the frequency of the digital signal, the sampling frequency, provided by the analog to digital converter must be at least two times a highest frequency component of the transmitted information signal according to the Nyquist Criteria.

To achieve these requirements, the frequency at which the modulated signal is provided to the receiver is typically multiplied by a reference clock signal. When multiplying two frequencies which are either sine or cosine waves, the product of the "multiply" operation creates two components. A first component is simply the difference between the two frequencies, and a second component is the addition of the same two frequencies. The multiplied modulated information signal may then be provided to an oversampling analog to digital (A/D) converter at a frequency which will allow the A/D converter to function efficiently. A sampling clock provides a signal to the A/D converter such that the modulated information is converted to a digital form and output at a predetermined sampling frequency. The predetermined sampling frequency is typically a fraction of an input clock frequency input to the A/D converter and is dependent on the specifications of the A/D converter. For example, in a commercially available sigma-delta A/D converter sold by Motorola Inc. as the DSP56ADC16, the input clock frequency is one hundred twenty-eight times the sampling frequency of an output signal of the A/D converter.

Although the receivers described above provide a modulated signal at a lower frequency, additional phase error is introduced by the differing phases of the reference clock signal and the sampling clock. The additional phase error is then reflected in the digital information signal output from the A/D converter.

Additionally, the signal provided by the A/D converter must be demodulated by the receiver circuitry. A demodulation operation is dependent on the ratio of the center frequency of the signal input to the A/D converter and the frequency of the signal output provided by the A/D converter. Typically, either the cosine or sine of the ratio must be calculated for subsequent use in the receiver. To calculate either the cosine or sine of a value, the receiver must provide a memory storage table from which the cosine or sine value may be interpolated. Interpolation between table values often requires intensive instructions and a significant amount of time. Therefore, both the phase error and the form of a modulated signal do not allow the signal to be readily demodulated in a timely manner.

SUMMARY OF THE INVENTION

The previously mentioned needs are fulfilled with the present invention. Accordingly, there is provided, in one form, a frequency translating coherent analog to digital conversion system for modulated signals comprising an analog signal multiplier having a first input for receiving a modulated input signal, a second input for receiving a down conversion reference frequency, and an output for providing an intermediate frequency signal. The frequency translating coherent analog to digital conversion system also comprises an oversampling analog to digital converter having an input for receiving the intermediate frequency signal at a predetermined center frequency, a clock input for receiving a reference clock signal, and an output for providing a filtered output digital signal at a predetermined sampling frequency. A reference clock means is coupled to the clock input of the oversampling analog to digital converter to provide the reference clock signal. A frequency divider has an input coupled to the reference clock signal. The frequency divider divides the reference clock signal by a predetermined divisor and has an output coupled to the second input of the analog signal multiplier for providing the down conversion reference frequency signal.

These and other features, and advantages, will be more clearly understood from the following detailed description taken in conjunction with the accompanying drawings.

DETAILED DESCRIPTION OF A PREFERRED EMBODIMENT

When a digital information signal is transmitted from a transmitter to a receiver, the information signal is converted to an analog signal which is either amplitude or frequency modulated in accordance with predetermined specifications. The modulated analog signal is sent to a first portion of the receiver and is down converted to an intermediate frequency. The modulated signal is then converted to a digital signal by an analog to digital (A/D) system. The converted digital signal is provided to a second portion (not shown herein) of the receiver to be further manipulated.

The analog to digital conversion system described herein converts an analog signal to a filtered output digital signal coherently such that a phase error is not generated by the conversion operation. Therefore, in subsequent operations, the phase error does not affect the transmitted signal. Additionally, the digital output signal has a sampling frequency at which the digital signal is transmitted. The sampling frequency is an integer multiple of a center frequency of the analog signal. Because an integer multiple is used, faster data manipulation is possible in a next processing stage (not shown herein).

Figure 1:
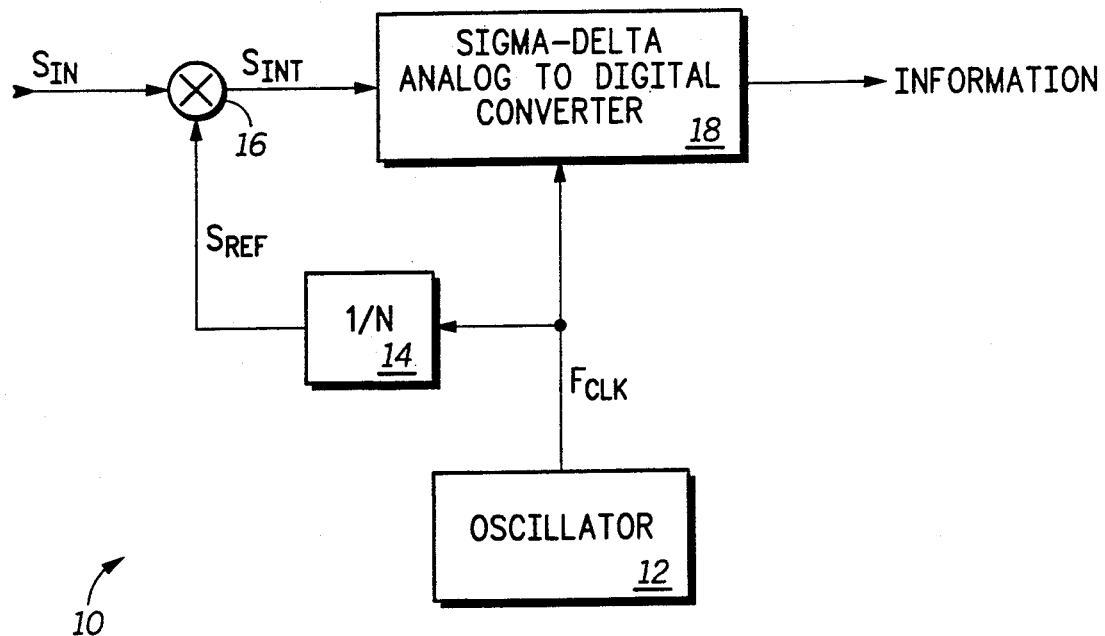
FIG. 1 illustrates in block diagram form an analog to digital conversion system for modulated signals in accordance with the present invention.

FIG. 1 illustrates in one form an analog to digital (A/D) conversion system 10. The A/D conversion system 10 is formed generally of an oscillator 12, a frequency divider 14, an analog signal multiplier 16, and a sigma-delta analog to digital (A/D) converter 18.

The oscillator 12 provides a clock signal labelled "$F_{clk}$" to a clock input of both the frequency divider 14 and the sigma-delta A/D converter 18. The frequency divider 14 provides an output labelled "$S_{ref}$" to a reference frequency input of analog signal multiplier 16. A signal labelled "$S_{in}$" provides a transmitted frequency input to the analog signal multiplier 16. An output of analog signal multiplier 16 is a signal labelled "$S_{int}$." The $S_{int}$ signal provides an intermediate frequency signal to an input of the sigma-delta A/D converter 18. The sigma-delta A/D converter 18 subsequently provides a digital equivalent of the intermediate frequency signal via a signal labelled "Information."

During operation, the oscillator 12 provides the $F_{clk}$ signal to both the frequency divider 14 and the A/D converter 18 at a predetermined frequency. The predetermined frequency is generally determined by an industry standard oscillator value. The frequency divider 14 divides the frequency of the $F_{clk}$ signal by an integer value N, and outputs the result via the $S_{ref}$ signal. Therefore, the $F_{clk}$ signal is N times the $S_{ref}$ signal.

The $S_{in}$ and the $S_{ref}$ signals are then multiplied together by the analog signal multiplier 16 to produce a result in which the information transferred via the $S_{in}$ signal remains the same, but the frequency at which the information is transferred is significantly changed.

Assume that the $S_{ref}$ signal is a square wave with a fundamental frequency of $\omega_{ref}$ and, therefore, that the $S_{ref}$ signal can be expressed as:

$$S_{ref} = \sum_{n=1}^{\infty} (A_m \cos(\omega_{ref} nt + \theta_n)). \quad (1)$$

Assume that $\theta_n$ is a phase of a nth order harmonic frequency. Subsequently, a frequency multiplication of $S_{in}$ and $S_{ref}$ would produce the $S_{int}$ signal in accordance with the following equation:

$$S_{int} = \cos(\omega_{in} t) \sum_{n=1}^{\infty} (A_m \cos(\omega_{ref} nt + \theta_n)) \quad (2)$$

$$S_{int} = \sum_{n=1}^{\infty} (A_m/2)[\cos(\omega_{in} - \omega_{ref} nt - \theta_n) + \cos(\omega_{in} + \omega_{ref} nt + \theta_n)]. \quad (3)$$

The analog signal multiplier 16 provides the result of equation (3), the $S_{int}$ signal, to the input of the sigma-delta A/D converter 18. Equation (3) subtracts and adds two frequencies, $\omega_{in}$ and $\omega_{ref}$, to provide a first and a second information signal which contain the same information as the $S_{in}$ signal, but which are respectively transferred at a significantly lower and higher frequency than the $S_{in}$ signal. The $S_{int}$ signal is, in fact, transmitted at both a frequency equal to the difference in the frequencies of the $S_{in}$ and the $S_{ref}$ signals, and at a frequency equal to the addition of the frequencies of the $S_{in}$ and the $S_{ref}$ signals.

The $S_{int}$ signal is then input to the sigma-delta A/D converter 18. The sigma-delta A/D converter 18 contains a digital decimation filter (not shown) which removes a plurality of components of the $S_{int}$ signal which are not within a predetermined bandwidth of the $S_{int}$ signal. For example, the component of equation (3) containing the addition of the $\omega_{in} + \omega_{ref} nt$ signals results in a frequency which is high enough to be attenuated by the sigma-delta A/D converter 18. The sigma-delta converter 18 then outputs a digital form of the $S_{int}$ signal which is the Information signal.

The frequency of the $S_{int}$ signal must be within a predetermined range of frequencies for the A/D converter 18 to perform correctly. The predetermined range of frequencies is determined by a specification of the sigma-delta A/D converter 18, and is dependent on the manufacturer. For example, a Motorola DSP56ADC16 sigma-delta analog to digital converter must provide the Information signal at an output frequency less than 100 kilohertz to provide accurate results. In the illustrated form, the predetermined range of frequencies is less than 100 kilohertz.

Because the $S_{in}$ signal is generally an industry standard frequency of 450 kilohertz for amplitude modulation, the frequency of the $S_{ref}$ signal must be within a relatively small band of chosen frequencies. Therefore, the frequency divider 14 must divide by an integer value of N which will insure that the $S_{int}$ signal is within the predetermined range of frequencies.

The integer value of N is also chosen to insure that an integer ratio exists between the frequencies of the Information signal and the $S_{int}$ signal. If the ratio of frequencies between the Information signal and the $S_{int}$ signal is an integer, a subsequent receiver circuit (not shown) for further demodulation would not be required to interpolate a sine or cosine value from a memory storage table (not shown). Rather, the integer ratio between the input and output frequencies of the A/D converter 18 allows the sine or cosine value to be a repeatable value which may be determined without interpolation between a plurality of sine or cosine values in a memory storage table. Therefore, demodulation of the Information signal is more easily accomplished.

The frequency divider 14 enables the same oscillator 12 to be used for both the analog signal multiplier 16 and the sigma-delta analog to digital converter 18. Therefore, the Information signal provided by the sigma-delta A/D converter 18 reflects only a phase component inherent in the $S_{in}$ signal, and does not reflect a phase error produced by the receiver circuitry.

It should be understood that oscillator 12, frequency divider 14, and analog signal multiplier 16 may be readily implemented by respectively using a conventional oscillator, frequency divider circuit, and analog signal multiplier circuit. Also, in one form, sigma-delta A/D converter 18 may be implemented by using the previously mentioned DSP56ADC16 converted or other commercially available oversampling analog to digital converters.

Figure 2:
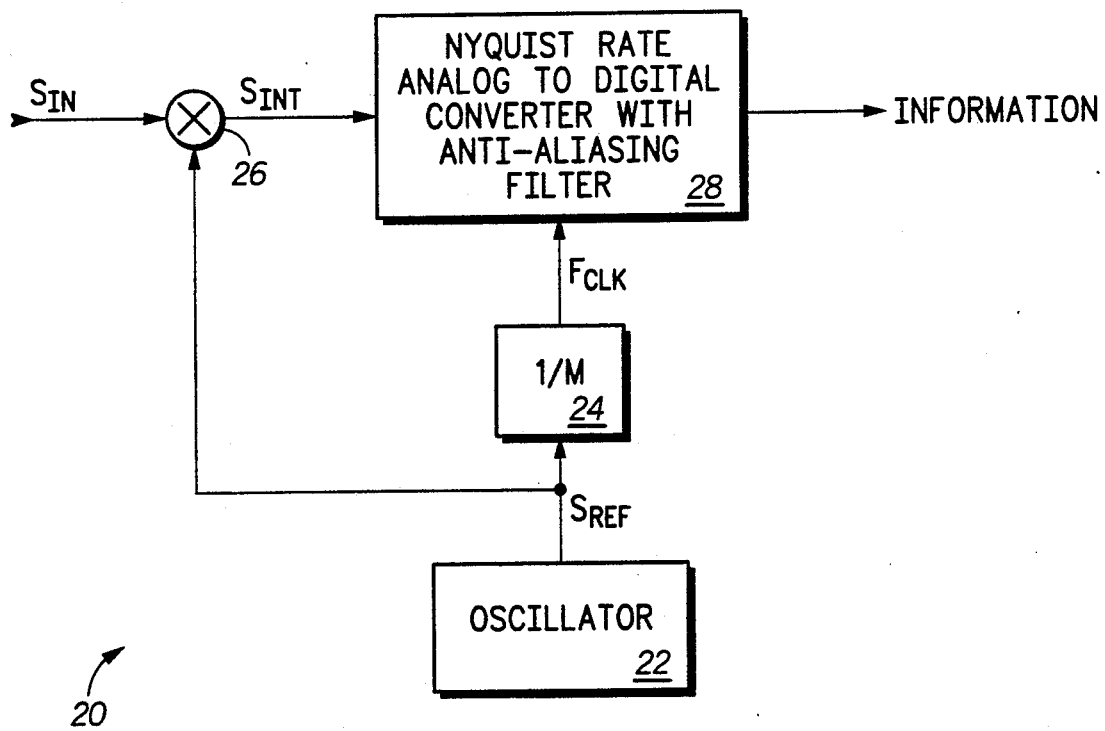
FIG. 2 illustrates in block diagram form another embodiment of the analog to digital conversion system for modulated signals in accordance with the present invention.

FIG. 2 illustrates another form of the present invention. An A/D conversion system 20 is formed generally of an oscillator 22, a frequency divider 24, an analog signal multiplier 26, and a Nyquist rate A/D converter 28. The Nyquist rate A/D converter 28 is generally a conventional flash or SAR type A/D converter.

The oscillator 22 provides a clock signal labelled "$S_{ref}$" to a clock input of both the frequency divider 24 and the analog signal multiplier 26. The frequency divider 24 provides an output labelled "$F_{clk}$" to a reference frequency input of the Nyquist rate A/D converter 28. A signal labelled "$S_{in}$" provides a transmitted frequency input to the analog signal multiplier 26. An output of analog signal multiplier 26 is a signal labelled "$S_{int}$". The $S_{int}$ signal provides an intermediate frequency signal to an input of the Nyquist rate A/D converter 28. The Nyquist rate A/D converter 28 subsequently provides a digital equivalent of the input information signal labelled "Information."

During operation, the oscillator 22 provides the $S_{ref}$ signal to both the frequency divider 24 and the analog signal multiplier 26 at a predetermined frequency. The frequency divider 24 divides the frequency of the $S_{ref}$ signal by an integer value M, and outputs the result via the $F_{clk}$ signal. The $S_{ref}$ signal is, therefore, M times the $F_{clk}$ signal.

The $S_{in}$ and the $S_{ref}$ signals are multiplied together by the analog signal multiplier 26 to produce a result in which the information transferred via the $S_{in}$ signal remains the same, but the frequency at which the information is transferred is significantly changed.

As in the first example, the analog signal multiplier 26 provides the $S_{int}$ signal of equation (3) as the $S_{int}$ signal to the information input of the Nyquist rate A/D converter 28. Equation (3) subtracts and adds two frequencies, $\omega_{in}$ and $\omega_{ref}$, to provide both a first and a second information signal which contain the same information as the $S_{in}$ signal, but are respectively transferred at a significantly lower and higher frequency than the $S_{in}$ signal. The $S_{int}$ signal is, in fact, transmitted at a frequency equal to the difference in the frequencies of the $S_{in}$ and the $S_{ref}$ signals, and at a frequency equal to the addition of the frequencies of the $S_{in}$ and the $S_{ref}$ signals.

The $S_{int}$ signal is then input to the Nyquist rate A/D converter 28. The Nyquist rate A/D converter 28 contains an anti-aliasing filter (not shown) which removes a plurality of components of the $S_{int}$ signal which are not within a predetermined bandwidth of the signal. As an example, the component of equation (3) containing the addition of the $\omega_{in}$ and $\omega_{ref}$nt signals results in a frequency which is high enough to be attenuated by the Nyquist rate A/D converter 28. The Nyquist rate A/D converter 28 then samples the $S_{int}$ signal and converts the signal to a digital form which is output as the Information signal.

The frequency of the $S_{int}$ signal must be within a predetermined range of frequencies for the Nyquist rate A/D converter 28 to perform correctly. As well, the $F_{clk}$ signal must also be within a predetermined range of frequencies for the A/D converter 28 to sample the input signal adequately. The predetermined range of frequencies of both the $S_{int}$ and $F_{clk}$ signals is determined by a specification of the Nyquist rate A/D converter 28.

Because the $S_{in}$ signal is generally an industry standard frequency of 450 kilohertz, the frequency of the $S_{ref}$ signal must be within a relatively small band of chosen frequencies. Therefore, the oscillator 22 must provide a $S_{ref}$ signal which will produce a $S_{int}$ signal in the predetermined range of frequencies required by the Nyquist rate A/D converter 28.

Additionally, the frequency divider 24 must divide the $S_{ref}$ signal by a value of M which will insure that the $F_{clk}$ signal is within the predetermined range of frequencies required by the Nyquist rate A/D converter 28.

The frequency of the $S_{ref}$ clock signal provided by the oscillator 22 is also chosen to insure that an integer ratio exists between the sampling frequency of the output Information signal and the center frequency of the $S_{int}$ signal. If the integer ratio exists between the Information signal sampling frequency and the $S_{int}$ signal center frequency, a subsequent receiver circuit (not shown) would not be required to interpolate a sine or cosine value from a memory storage table (not shown). Rather, the integer ratio between the input and output frequencies of the Nyquist rate A/D converter 28 allows the sine or cosine value to be a repeatable value. Therefore, demodulation of the Information signal is more easily accomplished.

The frequency divider 24 enables the same oscillator 22 to be used for both the analog signal multiplier 26 and the Nyquist rate analog to digital converter 28. Therefore, the Information signal provided by the Nyquist rate A/D converter 28 reflects only a phase component inherent in the $S_{in}$ signal, and does not transmit a signal modified by a phase error produced by the receiver circuitry.

There has been provided herein, a frequency translating coherent analog to digital conversion system for modulated signals. In FIG. 1, a clock frequency provided by oscillator 12 generates the clock frequencies for both the frequency divider 14 and the sigma-delta A/D converter 18. Although the clock frequency is divided by frequency divider 14, the phase of the divided clock signal remains the same as the phase of the clock signal input to the sigma-delta A/D converter 18. When the divided clock signal is input to the analog signal multiplier 16, the phase of the output signal is the same as that of the clock signal input to the sigma-delta A/D converter 18. Therefore, a phase difference does not exist between the output signal of the analog signal multiplier 16 and the oscillator signal of the sigma-delta A/D converter 18. Because a difference in the phases of the analog signal multiplier 16 output signal and the oscillator frequency of the sigma-delta A/D converter 18 does not exist, a phase error is not reflected in the digital output of the sigma-delta A/D converter 18.

Additionally, by carefully selecting the integer value N, several criteria to enable the sigma-delta A/D converter 18 to function properly may be satisfied. As important, however, the frequency divider 14 enables the designer of the A/D conversion system 10 to choose the value N such that the sampling frequency of the Information signal has an integer relationship to the center frequency of the input frequency. The integer relationship aids during demodulation of the modulated information input signal. The integer relationship between the input and output frequencies of the A/D converter 18 results in a predetermined number of repeating sine or cosine values which may be accessed without requiring interpolation of a memory storage table to determine unknown sine and cosine values.

Similarly, the frequency translating coherent analog to digital conversion system for modulated signals illustrated in FIG. 2 also provides an A/D conversion system 20 which introduces no phase error in the digital signal output by the Nyquist rate A/D converter 28. Again, the frequency divider 24 allows the user of the system 20 to choose the value of M such that the ratio between the input frequency and the output frequency of the Nyquist rate A/D converter 28 is an integer.

It should be well understood that the coherent analog to digital conversion system for modulated signals described herein provides an effective and unique solution to coherently translate signals to a predetermined frequency and to convert the signals to a digital signal without the introduction of phase error. However, the implementation of the invention described herein is provided by way of example only. Many other implementations may exist for executing the function described herein. For example, the frequency dividers, such as 14 and 24, should be chosen such that the divisor provides a reference frequency which will respectively enable either sigma-delta A/D converter 18 or Nyquist rate A/D converter 28 to function properly. As well, the divisor must be chosen to provide an integer relationship between the frequency of the input signal and the frequency of the output signal of either the sigma-delta A/D converter 18 or the Nyquist rate A/D converter 28. Additionally, both the sigma-delta A/D converter 18 and the Nyquist rate A/D converter 28 may implemented in any standard logic form.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. A frequency translating coherent analog to digital conversion system for modulated signals, comprising:
   an analog signal multiplier having a first input for receiving a modulated input signal, a second input for receiving a down conversion reference frequency signal, and an output for providing an intermediate frequency signal;
   an oversampling analog to digital converter having an input for receiving the intermediate frequency signal at a predetermined center frequency, a clock input for receiving a reference clock signal, and an output for providing a filtered output digital signal at a predetermined sampling frequency;
   a reference clock means coupled to the clock input of the oversampling analog to digital converter for providing the reference clock signal; and
   a frequency divider having an input connected to the reference clock signal, the frequency divider dividing the reference clock signal by a predetermined divisor and having an output connected to the second input of the analog signal multiplier for providing the down conversion reference frequency signal.

2. The frequency translating coherent analog to digital conversion system of claim 1 wherein the oversampling analog to digital converter provides a filtered output sampled signal having a sampling frequency which is a predetermined integer multiple of the center frequency of the intermediate frequency signal.

3. The frequency translating coherent analog to digital conversion system of claim 2 wherein the predetermined integer multiple is a multiple of two.

4. The frequency translating coherent analog to digital conversion system of claim 1 wherein the oversampling analog to digital converter is a sigma-delta analog to digital converter.

5. The frequency translating coherent analog to digital conversion system of claim 1 wherein the frequency divider divides the reference clock signal by an integer divisor.

6. The frequency translating coherent analog to digital conversion system of claim 1 wherein the intermediate frequency provided by the analog signal multiplier is less than the center frequency of the modulated input signal.

7. A method for providing a coherent analog to digital conversion of modulated input signals, comprising the steps of:
   providing an analog signal multiplier having a first input for receiving a modulated input signal, a second input for receiving a down conversion reference frequency signal, and an output for providing an intermediate frequency signal;
   providing an oversampling analog to digital converter having an input for receiving the intermediate frequency signal at a predetermined center frequency, a clock input for receiving a reference clock signal, and an output for providing a filtered output digital signal at a predetermined sampling frequency;
   coupling a reference clock means to the clock input of the oversampling analog to digital converter to provide the reference clock signal; and connecting an input of a frequency divider to the reference clock signal, the frequency divider dividing the reference clock signal by a predetermined divisor and having an output connected to the second input of the analog signal multiplier for providing the down conversion reference frequency signal.

8. The method of claim 7 wherein the reference clock means provides a reference clock signal having a frequency which is a predetermined integer multiple of the intermediate frequency signal.

9. The method of claim 7 wherein the oversampling analog to digital converter is a sigma-delta analog to digital converter.

10. A frequency translating coherent analog to digital conversion system for modulated signals, comprising:
    an analog signal multiplier having a first input for receiving a modulated input signal, a second input for receiving a reference clock signal, and an output for providing an intermediate frequency signal;
    an analog to digital converter having a first input for receiving the intermediate frequency, a second input for receiving a down conversion reference frequency, and an output for providing a filtered output sampled signal at a predetermined frequency;
    a reference clock means coupled to the second input of the analog signal multiplier for providing the reference clock signal; and
    a frequency divider having an input coupled to the reference clock signal, the frequency divider dividing the reference clock signal by a predetermined divisor and having an output coupled to the analog to digital converter for providing the down conversion reference frequency signal.

11. The analog to digital conversion system of claim 10 wherein the analog to digital converter provides a filtered output sampled signal at a frequency which is a predetermined integer multiple of a frequency of the intermediate frequency signal.

12. The analog to digital conversion system of claim 11 wherein the predetermined integer multiple is a multiple of two.

13. The analog to digital conversion system of claim 10 wherein the analog to digital converter is a Nyquist rate analog to digital converter.

14. The analog to digital conversion system of claim 10 wherein the frequency divider divides the reference clock signal by an integer divisor.

15. The analog to digital conversion system of claim 10 wherein the intermediate frequency provided by the analog signal multiplier is less than the frequency of the modulated input signal.

* * * * *